United States Patent
Papasouliotis et al.

(10) Patent No.: US 6,846,391 B1
(45) Date of Patent: Jan. 25, 2005

(54) PROCESS FOR DEPOSITING F-DOPED SILICA GLASS IN HIGH ASPECT RATIO STRUCTURES

(75) Inventors: George D. Papasouliotis, Cupertino, CA (US); Robert D. Tas, Morgan Hill, CA (US); Patrick A. Van Cleemput, Sunnyvale, CA (US); Bart van Schravendijk, Sunnyvale, CA (US)

(73) Assignee: Novellus Systems, San Jose, CA (US)

( * ) Notice: Subject to any disclaimer, the term of this patent is extended or adjusted under 35 U.S.C. 154(b) by 375 days.

(21) Appl. No.: 10/035,773

(22) Filed: Dec. 21, 2001

Related U.S. Application Data

(63) Continuation-in-part of application No. 09/053,554, filed on Apr. 1, 1998, now Pat. No. 6,395,150.

(51) Int. Cl.$^7$ .......................... C23C 14/00; C23C 14/32; H05H 1/02; B44C 1/22; C03C 15/00
(52) U.S. Cl. ........................ 204/192.37; 204/192.35; 427/574; 216/67
(58) Field of Search ........................ 204/192.32, 192.35, 204/192.37; 427/574, 569; 246/67, 69

(56) References Cited

U.S. PATENT DOCUMENTS

| | | | |
|---|---|---|---|
| 3,741,886 A | 6/1973 | Urbanck et al. ............ 204/298 |
| 4,264,409 A | 4/1981 | Forget et al. ................ 156/643 |
| 4,711,698 A * | 12/1987 | Douglas ...................... 438/722 |
| 4,882,299 A | 11/1989 | Freeman et al. ............. 437/233 |
| 4,937,094 A | 6/1990 | Doehler et al. |
| 5,118,384 A | 6/1992 | Harmon et al. .............. 156/643 |
| 5,160,405 A | 11/1992 | Miyauchi et al. ............ 156/643 |
| 5,270,264 A | 12/1993 | Andideh et al. ............. 437/228 |
| 5,376,211 A | 12/1994 | Harada et al. ............... 156/345 |
| 5,563,105 A * | 10/1996 | Dobuzinsky et al. ........ 438/784 |
| 5,571,576 A | 11/1996 | Qian et al. ................... 427/574 |
| 5,621,241 A | 4/1997 | Jain ............................. 257/632 |
| 5,641,712 A | 6/1997 | Grivna et al. ................ 438/624 |
| 5,872,058 A | 2/1999 | Van Cleemput et al. |
| 6,395,150 B1 * | 5/2002 | Van Cleemput et al. ...... 204/192.37 |

* cited by examiner

Primary Examiner—Patrick Ryan
Assistant Examiner—Julian Mercado
(74) Attorney, Agent, or Firm—Tom Chen; MacPherson Kwok Chen & Heid LLP

(57) ABSTRACT

A process for filling high aspect ratio gaps on substrates uses conventional high density plasma deposition processes to deposit fluorine-doped films, with an efficient sputtering inert gas, such as Ar, replaced or reduced with an inefficient sputtering inert gas such as He and/or hydrogen. By reducing the sputtering component, sidewall deposition from the sputtered material is reduced. Consequently, gaps with aspect ratios greater than 3.0:1 and spacings between lines less than 0.13 microns can be filled with low dielectric constant films without the formation of voids and without damaging circuit elements.

35 Claims, 2 Drawing Sheets

PROCESS FOR DEPOSITING F-DOPED SILICA GLASS IN HIGH ASPECT RATIO STRUCTURES

CROSS REFERENCE TO RELATED APPLICATIONS

This application is a continuation-in-part application of U.S. patent application Ser. No. 09/053,554, filed Apr. 1, 1998 now U.S. Pat. No. 6,395,150B1.

FIELD OF THE INVENTION

The present invention relates generally to methods of thin film deposition and, particularly, to a process of filling high aspect ratio gaps on substrates using high density plasma (HDP) chemical vapor deposition (CVD).

DESCRIPTION OF RELATED ART

Integrated circuits fabricated on semiconductor substrates for large scale integration require multiple levels of metal interconnections to electrically interconnect the discrete layers of semiconductor devices on the semiconductor chips. The different levels of interconnections are separated by various insulating or dielectric layers, which have etched via holes to connect one level of metal to the next. Typically, the insulating layer is a silicon oxide having a dielectric constant k of approximately 4.1 to approximately 4.5.

However, as semiconductor technology advances, circuit elements and dimensions on wafers or silicon substrates are becoming increasingly more dense. Consequently, the spacing between the metal lines in the interconnections needs to be reduced to effectively connect the various circuit elements. By decreasing the thickness of the insulating layers, intralevel and interlevel capacitances between the metal lines increase, since the capacitance is inversely proportional to the spacing between the lines. As capacitance increases, the RC time delay increases, which decreases the frequency response of the circuit and increases the signal propagation time through the circuit, thereby adversely affecting circuit performance. Therefore, it is desirable to minimize the RC time constant. One approach to reduce these RC time delays is to use an insulating material having a lower dielectric constant k to reduce the capacitance between the metal lines. Low-k layers also help to prevent cross-talk between different metal layers and reduce device power consumption.

One method to reduce the dielectric constant is to incorporate fluorine or other halogen elements such as chlorine or bromine into the silicon oxide layer. Fluorine-doped silicon oxide layers or films are commonly referred to as fluorosilicate glass (FSG) films. Using FSG films can typically reduce the dielectric constant down to about 3.5.

In addition to decreasing the dielectric constant, incorporating fluorine in silicon oxide layers also helps solve common problems encountered in fabricating smaller geometry devices with increasingly more dense circuit elements. In order to prevent unwanted interactions between these circuit elements, insulator-filled gaps or trenches located therebetween are provided to physically and electrically isolate the elements and conductive lines. However, as circuit densities continue to increase, the widths of these gaps decrease further, thereby increasing gap aspect ratios, typically defined as the gap height divided by the gap width. As a result, filling these narrower gaps becomes more difficult, which can lead to unwanted voids and discontinuities in the insulating or gap-fill material.

Currently, high density plasma (HDP) oxide deposition is used to fill high aspect ratio gaps. Generally, a high density plasma is any plasma having electron density greater or equal to $5 \times 10^9$ electrons per cubic centimeter. Typical HDP deposition processes employ chemical vapor deposition (CVD) with a gas mixture containing oxygen, silane, and argon to achieve simultaneous dielectric etching and deposition. In an HDP process, an RF bias is applied to a wafer substrate in a reaction chamber. Some of the gas molecules (particularly argon) in this gas mixture are ionized in the plasma and accelerate toward the wafer surface when the RF bias is applied to the substrate. Material is thereby sputtered when the ions strike the surface. As a result, dielectric material deposited on the wafer surface is simultaneously sputter-etched to help keep gaps open during the deposition process, which allows higher gap aspect ratios to be filled.

FIGS. 1A–1D illustrate, in more detail, the simultaneous etch and deposition (etch/dep) process described above. In FIG. 1A, $SiO_2$, formed from silane ($SiH_4$) and oxygen ($O_2$), begins depositing on the surface of a wafer 100 for filling a gap 110 between circuit elements 120. As the $SiO_2$ is being deposited, charged ions impinge on the $SiO_2$ or dielectric layer 125, thereby simultaneously etching the $SiO_2$ layer. However, because the etch rate at about 45° is approximately three to four times the etch rate on the horizontal surface, 45° facets 130 form at the corners of elements 120 during the deposition process, as shown in FIG. 1B. FIGS. 1C and 1D show the process continuing to fill gap 110 with simultaneous etching and deposition of $SiO_2$.

In FIGS. 1A–1D, the etch/dep ratio is optimized such that facets 130 remain at the corners of circuit elements 120 throughout the HDP deposition process. However, as shown in FIG. 2A, if the etch/dep ratio is decreased, facets 130 begin moving away from the corners of elements 120, and cusps 210 begin to form on sidewalls of gap 110. Cusp formation is due to some of the etched $SiO_2$ being redeposited on opposing surfaces through line-of-sight redeposition, even though most of the etched $SiO_2$ is emitted back into the plasma and pumped out of the reaction chamber. This redeposition increases as the distance between opposing surfaces decreases. Therefore, as facets 130 move away from the corners of elements 120, the line-of-sight paths are shortened, resulting in increased sidewall redeposition. At a certain point in the process, cusps 210 will meet and prevent further deposition below the cusps. When this occurs, a void 220 is created in dielectric layer 125, as shown in FIG. 2B. On the other hand, if the etch/dep ratio is increased, as shown in FIG. 3, the etching component can etch or "clip" material from the corners of elements 120, thereby damaging elements 120 and introducing etched contaminants 310 into dielectric layer 125.

The etch/dep ratio can be controlled by varying the flow rate of silane or other process gases, which affect the deposition rate, or by varying either the power supplied to the wafer for biasing or the flow rate of argon, which affect the sputter etch rate. Etch rates are typically increased by increasing the flow rate of argon, which is used solely to promote sputtering, rather than increasing power and expending large amounts of energy. Typical argon flow rates for HDP deposition range from 30%–60% or more of the total process gas flow-rate. By optimizing the etch/dep ratio, gaps with aspect ratios of up to about 3.0:1 can be filled without void formation. However, as shown in FIG. 4, filling higher gap aspect ratios results in voids 410 due to cusps 420 prematurely closing the gaps even if the etch/dep ratio is optimized to 1 at the element corners. As discussed above, this is due mainly to the shortened line-of-sight path between opposing sidewalls. If the etch rate is increased to keep the gaps open longer, undesirable corner clipping can occur.

Therefore, with increasing circuit densities, higher gap aspect ratios need to be filled using fluorine-doped films without the problems discussed above with current HDP deposition processes.

SUMMARY

In accordance with the present invention, a high aspect ratio gap-fill process uses high density plasma (HDP) deposition processes with helium, hydrogen, or other inefficient sputtering gases, instead of argon to reduce the effects of sputtering and redeposition for depositing fluorine-doped films, such as FSG (F-doped silica glass). Because the sputtering agent is greatly reduced, the etch or sputter rate decreases and the facet moves away from the element corners, as expected. Cusps form to a lesser extent on the element sidewalls because much less material is etched and available for redeposition. Consequently, with a greatly reduced sputter component, gaps remain open longer so that higher aspect ratio gaps can be filled without the formation of voids. The gas mixture can include both hydrogen and helium in some embodiments.

Because oxygen also contributes to the sputtering component, reducing the partial pressure of oxygen further reduces the sputtering and redeposition effect and allows increased gap-fill capabilities. However, in order to preserve the stoichiometry of the film, the partial pressure of silane ($SiH_4$) is decreased as well. Helium, which is an inefficient sputtering agent, can be added to maintain a constant overall process gas flow rate and provide a constant uniform deposition rate across the wafer.

The present invention will be better understood in light of the following detailed description, taken together with the accompanying drawings.

BRIEF DESCRIPTION OF THE DRAWINGS

Use of the same reference numbers in different figures indicates similar or like elements.

DETAILED DESCRIPTION

Figure 1A:
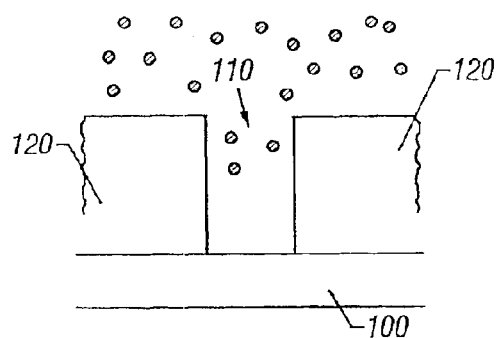
FIGS. 1A–1D are sequential views of a conventional HDP deposition process with optimized etch/dep ratios.
Figure 1B:
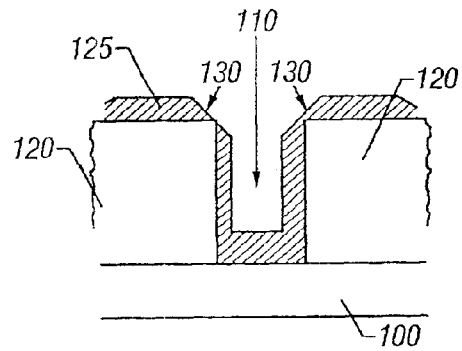
Figure 1C:
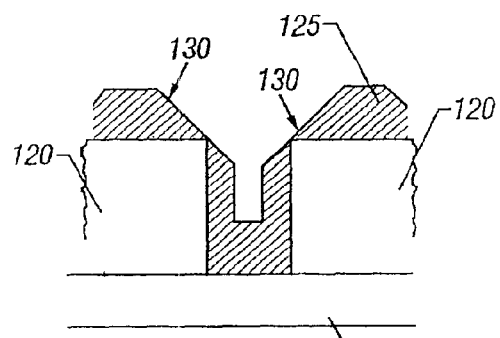
Figure 1D:
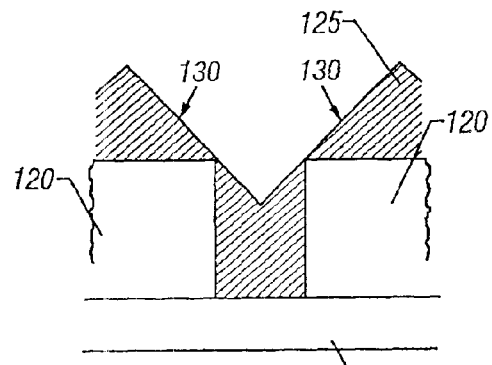
Figure 2A:
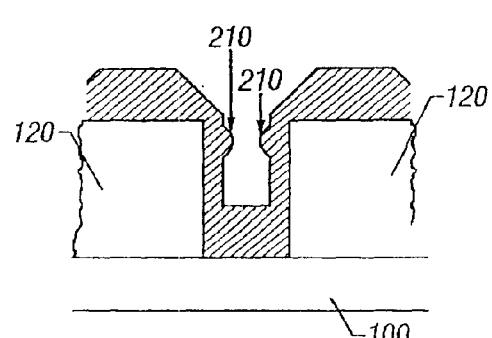
FIGS. 2A–2B are sequential views illustrating void formation when the etch/dep ratio decreases using a conventional HDP process.
Figure 2B:
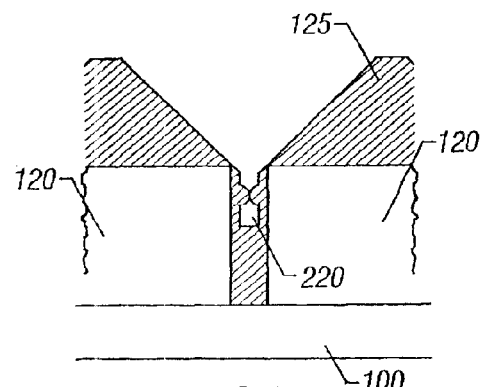
Figure 3:
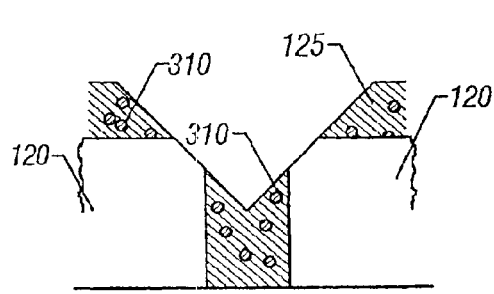
FIG. 3 is a picture of "clipped" corners when the etch/dep ratio increases using conventional HDP processes.
Figure 4:
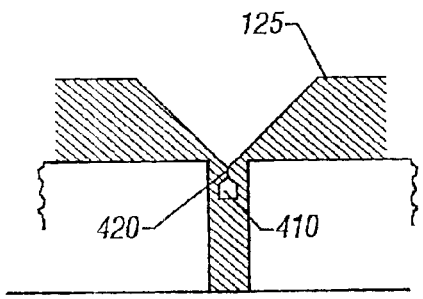
FIG. 4 is a picture of void formation when filling a high aspect ratio gap using a conventional HDP process.

In accordance with an embodiment of the present invention, a process using high density plasma (HDP) deposition with helium, hydrogen, or other inefficient inert sputtering gases, is provided, which allows high aspect ratio gaps to be filled using fluorine-doped films without voids or clipped corners associated with conventional methods. In other embodiments, the gas mixture includes both helium and hydrogen.

Similar to conventional HDP deposition processes, a gas mixture is used containing silane ($SiH_4$), a fluorine-bearing precursor, and oxygen ($O_2$). However, contrary to conventional HDP processes, argon (Ar) is not used; rather an inefficient sputtering gas with an atomic weight lower than Ar is used, such as helium (He), hydrogen ($H_2$), and/or neon (Ne). A mixture that includes $SiH_4$, $O_2$, a fluorine-bearing precursor, and hydrogen and/or He is used to simultaneously deposit and etch dielectric material, where $SiH_4$, $O_2$, and the fluorine-bearing precursor are used to form $SiO_2$ for the deposition component, and $O_2$ and He and/or hydrogen are used for the sputtering component. These gases are not limiting, and other suitable gases include any gases normally used for a particular film deposition process. As will be described below, adding $SiF_4$ or another fluorine-containing compound, such as $Si_2F_6$, to the gas mixture results in a fluorine-doped film, which has as an advantage of a low dielectric constant. As will be described below, fluorine-doped films of low dielectric constant can be deposited by adding $SiF_4$ or another fluorine-containing compound, such as $Si_2Fr$ or $SiH_2F_2$, to the gas mixture.

By replacing Ar with He and/or hydrogen, the sputtering and redeposition effect is greatly reduced. Further, since $O_2$ also contributes to sputtering, reducing the partial pressure of $O_2$ further reduces sputtering. Accordingly, less material is sputtered and redeposited, thereby allowing even higher aspect gap ratios to be filled. However, by reducing the partial pressure of $O_2$, the partial pressure of $SiH_4$ must also be reduced proportionally if the stoichiometry of the film is to be preserved. As a result of the partial pressures of both °2 and $SiH_4$ being reduced, the flow rate of the process gas decreases. Thus, in order to preserve the uniformity of the deposition rate across the wafer, He or another low weight inert gas, is added to maintain a constant overall process flow rate.

As an example, the present invention is used to form a gap-free fluorine-doped silicon oxide (FSG) film over high aspect gap ratios. Incorporating fluorine reduces the dielectric constant of the deposited film. Table 1 below lists typical gases and their respective gas flow ranges for forming an FSG film in an HDP-CVD reactor, where the actual gas flow amount depends upon the requirements of the film and the wafer size. Hydrogen and/or He also acts as a diluent in the gas mixture.

TABLE 1

| Gas | Flow Rate (sccm) |
|---|---|
| $SiH_4$ | 10–250 |
| $O_2$ | 10–1000 |
| He | 0–2000 |
| $SiF_4$ | 10–250 |
| Ne | 0–2000 |
| $H_2$ | 0–5000 |
| $N_2$ | 0–500 |
| Ar | 0–100 |

Those skilled in the art will recognize that Ar does not need to be completely eliminated if the concentration of He and/or hydrogen is high enough to dilute the effects of sputtering and redeposition in accordance with the present invention. Note that in Table 1 above, both He and hydrogen have a lower range of 0 sccm. However, as those skilled in the art will understand, He and hydrogen are never both at 0 sccm. If only He is used, hydrogen will be at 0 sccm, and if only hydrogen is used, He will be at 0 sccm. When hydrogen is used, the low range of hydrogen flow is 5 sccm. In some embodiments, a conventional substrate holder having an electrode is used to support the wafer. A radio frequency (RF) bias is applied to the substrate by supplying the electrode with at least 0.15 W/cm$^2$ of power. The RF frequency ranges between about 100 kHz and 27 MHz.

In addition to the reduction or elimination of Ar, the method of the present invention also allows lower pressures than prior HDP processes. The present invention can be run at pressures below 10 mTorr. Other system parameters are similar to conventional FSG film deposition. For example, the LF power typically varies from 1 kW to 15 kW, and the HF power typically varies from 0.5 kW to 10 kW depending on the wafer size (e.g., 200 or 300 mm diameter) and the requirements of the specific process being used. The backside He pressure is set by the temperature requirements of the process, with a typical range being between 0 and 15 Torr. Those skilled in the art will recognize that $SiF_4$ does not need to be the only fluorine-containing compound that can be used as a fluorine source. Other silicon fluorides (such as $Si_2F_6$ or $SiH_2F_2$) are within the scope of this invention. The inclusion of nitrogen in the reactive mixture is also within the scope of the invention.

The reduced sputter etch rate resulting from the replacement of Ar with He and/or hydrogen allows higher aspect ratio gaps to be filled without the formation of voids, as illustrated in FIGS. 5A–5D.

Figure 5A:
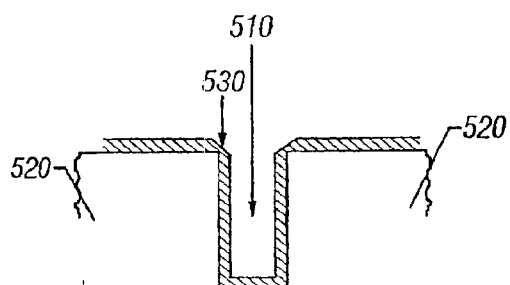
FIGS. 5A–5D are sequential views of high aspect ratio gaps filled with the method of the present invention.
Figure 5B:
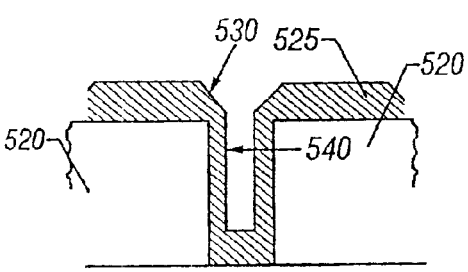
Figure 5C:
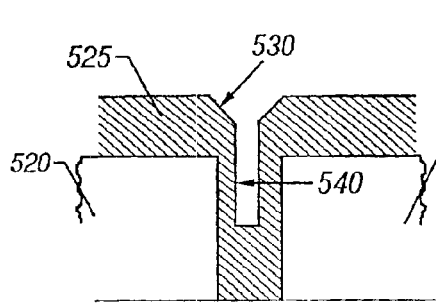

In FIG. 5A, circuit elements 520 are formed on a substrate or wafer 100, creating gaps 510 therebetween. Circuit elements 520 can be, for example, transistors, conductors, or interconnects. A gap 510 with a high aspect ratio, typically greater than 2.5:1, is filled using HDP deposition, where sputtering is accomplished with He and/or hydrogen and $O_2$. During the initial stages of the process, 450 facets 530 form at the corners of circuit elements 520, as shown in FIG. 5A. Even though drastically reduced, an etching component from the He and/or hydrogen and $O_2$ still exists to form the facets 530 in FIG. 5A. However, because the etching component is reduced, facets 530 begin to move away from the corners of circuit elements 520 as more material deposits on the surfaces to form the FSG or dielectric layer 525, as shown in FIGS. 5B and 5C.

Figure 5D:
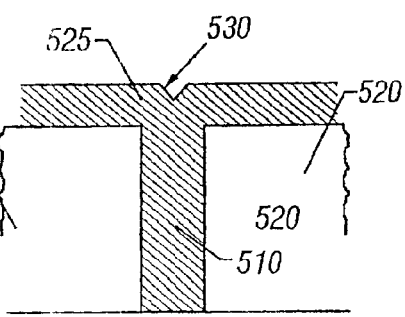

Another consequence of replacing Ar with He and/or hydrogen is that sidewall redeposition is reduced. Because the sputtering component is greatly reduced, much less material is available to redeposit on sidewalls 540 and facets 530, as shown in FIGS. 5B and 5C. As a result, cusp formation is drastically reduced, and facets move away more slowly from the corners of the circuit elements. Because there is very little sidewall deposition, which is mainly driven by redeposition, high aspect ratio gaps do not close prematurely even though the facets are moving away from the corners. FIG. 5D then shows high aspect ratio gap 510 filled without void formation or clipping. Note that since $O_2$ also acts as a sputtering agent, He and/or hydrogen can be used to reduce the sputtering effects from $O_2$.

In accordance with the present invention, gaps with aspect ratios greater than 3.0:1 and with spacing between lines less than 0.13 micron have been filled without the formation of voids. Therefore, by replacing an efficient sputtering agent such as Ar with an inefficient sputtering agent such as He and/or hydrogen, a void-free gapfill is possible at higher aspect ratios than are possible with conventional HDP deposition processes.

The above description illustrates the use of fluorine-doped silicon oxide for filling gaps between metal lines, such as in a BEOL (back-end-of-line) process in which electrical connections are made within the integrated circuit device. Using a fluorine-doped film results in many benefits, such as reduced signal delays, lower dielectric constants, and less cross-talk between layers. The method of the present invention can also be used in other steps in the production of integrated circuits where fluorine-doped films are deposited.

While particular embodiments of the present invention have been shown and described, it will be obvious to those skilled in the art that changes and modifications may be made without departing from this invention in its broader aspects. Therefore, the appended claims are to encompass within their scope all such changes and modifications as fall within the true spirit and scope of this invention.

We claim:

1. A process for filling gaps during integrated circuit production, comprising:

providing a gas mixture comprised of silicon-containing, oxygen-containing, and fluorine-containing components and comprising a first component, wherein said first component is selected from the group consisting of helium and hydrogen; and depositing a film over said gaps by using said gas mixture for simultaneous CVD and sputter etching using a plasma of uniform plasma density.

2. The process of claim 1, wherein said fluorine containing component is $SiF_4$, $Si_2F_6$, or $SiH_2F_2$.

3. The process of claim 2, wherein said fluorine-containing component is at a flow rate of 10 to 250 sccm.

4. The process of claim 1, wherein said gas mixture further comprises neon.

5. The process of claim 1, wherein said gas mixture further comprises argon.

6. The process of claim 1, wherein said gas mixture further comprises nitrogen.

7. The process of claim 1, wherein said gas mixture consists of both hydrogen and helium.

8. The process of claim 1, wherein said gas mixture consists of one first component, helium.

9. The process of claim 8, wherein said He is at a flow rate of 10 to 2000 sccm.

10. The process of claim 1, wherein said gas mixture consists of one first component, hydrogen.

11. The process of claim 10, wherein said hydrogen is at a flow rate of up to 5000 sccm.

12. The process of claim 1, further comprising applying a radio frequency bias to the substrate.

13. The process of claim 12, wherein said applying comprises:

supporting the substrate on a substrate holder having an electrode; and supplying said radio frequency bias to the substrate, the radio frequency bias being generated by supplying the electrode with at least 0.15 $W/cm^2$ of power.

14. The process of claim 12, wherein the radio frequency bias applied to the substrate is at the frequency range between about 100 kHz and 27 MHz.

15. A process for filling gaps during integrated circuit production, comprising:

depositing a film over said gaps by HDP deposition using a gas mixture comprised of silicon-containing, oxygen-containing, and fluorine-containing components and comprising one first component, wherein said first component is selected from the group consisting of helium and hydrogen, and wherein plasma utilized in the HDP deposition has a uniform plasma density greater or equal to or equal to $5\times10^9$ electrons per cubic centimeter.

16. The process of claim 15, wherein said fluorine-containing component is $SiF_4$, $Si_2F_6$, or $SiH_2F_2$.

17. The process of claim 15, wherein said gas mixture comprises neon.

18. The process of claim 15, wherein said gas mixture further comprises argon.

19. The process of claim 15, wherein said gas mixture further comprises nitrogen.

20. The process of claim 15, wherein said fluorine-containing component is at a flow rate of 10 to 250 sccm.

21. The process of claim 15, further comprising applying a radio frequency bias to the substrate.

22. The process of claim 21, wherein said applying comprises:

supporting the substrate on a substrate holder having an electrode; and supplying said radio frequency bias to the substrate, the radio frequency bias being generated by supplying the electrode with at least 0.15 W/cm$^2$ of power.

23. The process of claim 21, wherein the radio frequency bias applied to the substrate is at the frequency range between about 100 kHz and 27 MHz.

24. The process of claim 15, wherein said gas mixture consists of one first component, helium.

25. The process of claim 15, wherein said gas mixture consists of one first component, hydrogen.

26. A process for filling gaps during integrated circuit production, comprising:

providing a substrate in a high density plasma CVD reactor;

providing a gas mixture comprised of silicon-containing, oxygen-containing, and fluorine-containing components and comprising one first component, wherein said if first component is selected from a grouping consisting of helium and hydrogen; and depositing a film over said gaps by using a plasma of uniform plasma density and by using said gas mixture for simultaneous CVD and sputter etching.

27. The process of claim 26, wherein said fluorine-containing component is $SiF_4$, $Si_2F_6$, or $SiH_2F_2$.

28. The process of claim 26, wherein said gas mixture further comprises neon.

29. The process of claim 26, wherein said gas mixture further comprises argon.

30. The process of claim 26, wherein said gas mixture further comprises nitrogen.

31. The process of claim 26, further comprising applying a radio frequency bias to the substrate.

32. The process of claim 31, wherein said applying comprises:

supporting the substrate on a substrate holder having an electrode; and supplying said radio frequency bias to the substrate, the radio frequency bias being generated by supplying the electrode with at least 0.15 W/cm$^2$ of power.

33. The process of claim 31, wherein the radio frequency bias applied to the substrate is at the frequency range between about 100 kHz and 27 MHz.

34. The process of claim 26, wherein said gas mixture consists of one first component, helium.

35. The process of claim 26, wherein said gas mixture consists of one first component, hydrogen.

* * * * *

UNITED STATES PATENT AND TRADEMARK OFFICE
CERTIFICATE OF CORRECTION

PATENT NO. : 6,846,391 B1
DATED : January 25, 2005
INVENTOR(S) : George D. Papasouliotis et al.

It is certified that error appears in the above-identified patent and that said Letters Patent is hereby corrected as shown below:

Column 7,
Line 28, delete "if first" and replace with -- first --.

Signed and Sealed this

Eighteenth Day of October, 2005

JON W. DUDAS
*Director of the United States Patent and Trademark Office*